(12) United States Patent
Giri et al.

(10) Patent No.: US 6,765,152 B2
(45) Date of Patent: Jul. 20, 2004

(54) MULTICHIP MODULE HAVING CHIPS ON TWO SIDES

(75) Inventors: Ajay Prabhakar Giri, Poughkeepsie, NY (US); Joseph Michael Sullivan, Wappingers Falls, NY (US); Christopher Lee Tessler, Campbell Hall, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/260,086

(22) Filed: Sep. 27, 2002

(65) Prior Publication Data

US 2004/0060732 A1 Apr. 1, 2004

(51) Int. Cl.[7] .................................................. H05K 1/16
(52) U.S. Cl. ....................... 174/260; 174/261; 174/262; 361/760; 361/784; 257/738; 257/778
(58) Field of Search ................................ 174/260, 261, 174/262, 263, 264, 266, 252, 255; 361/760, 752, 767, 783, 784, 807, 809, 813; 257/698, 700, 706, 712, 719, 737, 738, 778

(56) References Cited

U.S. PATENT DOCUMENTS

| | | | |
|---|---|---|---|
| 5,633,532 A | * | 5/1997 | Sohara et al. ................ 257/700 |
| 5,710,071 A | | 1/1998 | Beddingfield et al. |
| 5,834,334 A | | 11/1998 | Leedy |
| 5,985,693 A | | 11/1999 | Leedy |
| 6,010,951 A | | 1/2000 | Pushpala et al. |
| 6,281,042 B1 | * | 8/2001 | Ahn et al. ................... 438/108 |
| 6,281,452 B1 | | 8/2001 | Prasad et al. |
| 6,291,268 B1 | * | 9/2001 | Ho .............................. 438/108 |
| 6,304,232 B1 | | 10/2001 | Brown et al. |
| 6,347,037 B2 | * | 2/2002 | Iijima et al. ................. 361/704 |
| 6,376,917 B1 | * | 4/2002 | Takeshita et al. ........... 257/778 |
| 6,424,034 B1 | * | 7/2002 | Ahn et al. ................... 257/723 |

* cited by examiner

Primary Examiner—Kamand Cuneo
Assistant Examiner—J B Patel
(74) Attorney, Agent, or Firm—Ira D. Blecker

(57) ABSTRACT

A multichip module including a frame having contacts suitable for making an electrical connection with an article, preferably a printed wiring board or similar, which is the next level of packaging, a multilayer thin film structure mounted to the frame, and semiconductor devices mounted to the thin film structure with at least one semiconductor device on each of two opposed sides of the thin film structure. The thin film structure includes arrays of pads on opposed surfaces of the thin film structure for connecting the thin film structure to the semiconductor devices and the frame. The thin film structure further includes wiring for chip to chip connectivity and for connecting to the frame.

13 Claims, 4 Drawing Sheets

MULTICHIP MODULE HAVING CHIPS ON TWO SIDES

BACKGROUND OF THE INVENTION

The present invention generally relates to semiconductor device packaging and, more particularly, to multichip packages and the interconnecting of the chips within the package using thin films.

There is a need in the semiconductor packaging industry for high performance, low cost, small size, and lightweight multichip packaging technology. Applications such as high performance gaming platforms up through super computers will require multichip packages to optimize performance, cost and overall package size and weight. Such package optimization becomes especially important where multiple processor chips and cache memory interact.

Current solutions such as organic chip carriers, ceramic chip carriers or silicon chip carriers all have limitations related either to size, weight, performance, cost or a combination thereof with respect to these applications. Ceramic multichip modules tend to be large in area, thickness and weight. Organic packages can reduce the size and weight but do not have the same level of circuit interconnect capability so performance suffers. Silicon packages with thin film wiring provide both weight and size savings with a high level of interconnect capability but are costly to produce. And, all three of the previous solutions cannot provide close chip packaging in order to minimize the chip to chip wiring net lengths and therefore maximize performance.

In order to maximize chip to chip performance on multichip packages, it is necessary to bring the chip to chip interconnects as close together as possible. Conventional solutions using ceramic, organic, silicon or a combination thereof, with or without thin films, place the chips side by side with power, ground and signals traveling up from the bottom of the carrier (i.e., the interface to the "outside world") and chip to chip interconnects traveling across the carrier between chips. The result is a long path between chips which adversely impacts performance. Solutions with chips on both sides of the chip carrier reduce path length but do not optimize it. Solutions incorporating direct chip to chip connections, either face to face or on top of each other (e.g., three dimensional packaging) cannot meet high power or cooling requirements for high performance processors.

Various solutions have been proposed to maximize chip or chip to chip performance on multichip packages.

Beddingfield et al. U.S. Pat. No. 5,710,071, the disclosure of which is incorporated by reference herein, discloses a conventional single chip or multichip package in which wiring extends vertically between the chip or chips on the top of the package and the input/output connections on the bottom of the package and horizontally for power, signal and ground functions.

Prasad et al. U.S. Pat. No. 6,281,452, the disclosure of which is incorporated by reference herein, discloses the formation of a multilayer thin film structure on a carrier which is then transferred to a permanent substrate, e.g., a ceramic substrate. This particular reference discloses an interposer between the multilayer thin film structure and the permanent substrate.

Brown et al. U.S. Pat. No. 6,304,232, the disclosure of which is incorporated by reference herein, discloses multiple stacked printed circuit boards as a three dimensional method for densely packaging passive and active components. The arrangement shown is a relatively thick, low density package and does not address closely coupled, low inductance, high performance packaging requirements.

Pushpala al. U.S. Pat. No. 6,010,951, the disclosure of which is incorporated by reference herein, discloses a semiconductor substrate having integrated circuits on two sides but does not address interconnecting the integrated circuits on one side to the integrated circuits on the other side.

Leedy U.S. Pat. Nos. 5,834,334 and 5,985,693, the disclosures of which are incorporated by reference herein, disclose the fabrication of semiconductor devices on a thinned semiconductor substrate covered by a thin membrane of silicon dioxide or silicon nitride which is held by a frame. In an alternative embodiment, conventional chips are mounted on the membrane. These references do not address two sided mounting of chips or providing wiring for power and ground requirements.

The foregoing references fail to provide a multichip package design that improves on the size, weight, chip to chip interconnectivity (i.e., performance) and cost of the multichip package.

Accordingly, it is a purpose of the present invention to have a multichip package which is small in size, light in weight, has chip to chip interconnectivity and reasonable in cost.

It is a further purpose of the present invention to have a multichip package which additionally has adequate power and ground distribution and cooling capability.

These and other purposes of the present invention will become more apparent after referring to the following description of the invention considered in conjunction with the accompanying drawings.

BRIEF SUMMARY OF THE INVENTION

The purposes of the invention have been achieved by providing, according to a first aspect of the present invention, a multichip module comprising:

a frame having contacts suitable for making an electrical connection with an article;

a multilayer thin film structure mounted to the frame; and a plurality of semiconductor devices mounted to the thin film structure with at least one semiconductor device on each of two opposed surfaces of the thin film structure;

the thin film structure comprising (i) a first array of pads on a first surface of the thin film structure for connection to at least one semiconductor device, (ii) a second array of pads on an opposed surface of the thin film structure for connection to at least a second semiconductor device, (iii) a third array of pads on a surface of the thin film structure and proximate to the periphery of the thin film structure for connection between the thin film structure and the frame and (iv) wiring within the thin film structure for connecting between the first and second array of pads and for connecting between the thin film structure and the third array of pads.

According to a second aspect of the invention, there is provided a method of forming a multichip module comprising the steps of:

forming a thin film structure on a temporary carrier;

attaching an electrically insulating frame to a first surface of the thin film structure;

attaching at least one semiconductor device to the first surface of the thin film structure;

removing the temporary carrier; and attaching at least one semiconductor device to a second surface of the thin film structure, wherein the first surface is opposed to the second surface and wherein there is interconnectivity through the thin film structure between the semiconductor devices and the frame.

BRIEF DESCRIPTION OF THE DRAWINGS

The features of the invention believed to be novel and the elements characteristic of the invention are set forth with particularity in the appended claims.

The Figures are for illustration purposes only and are not drawn to scale. The invention itself, however, both as to organization and method of operation, may best be understood by reference to the detailed description which follows taken in conjunction with the accompanying drawings in which.

DETAILED DESCRIPTION OF THE INVENTION

Figure 1:
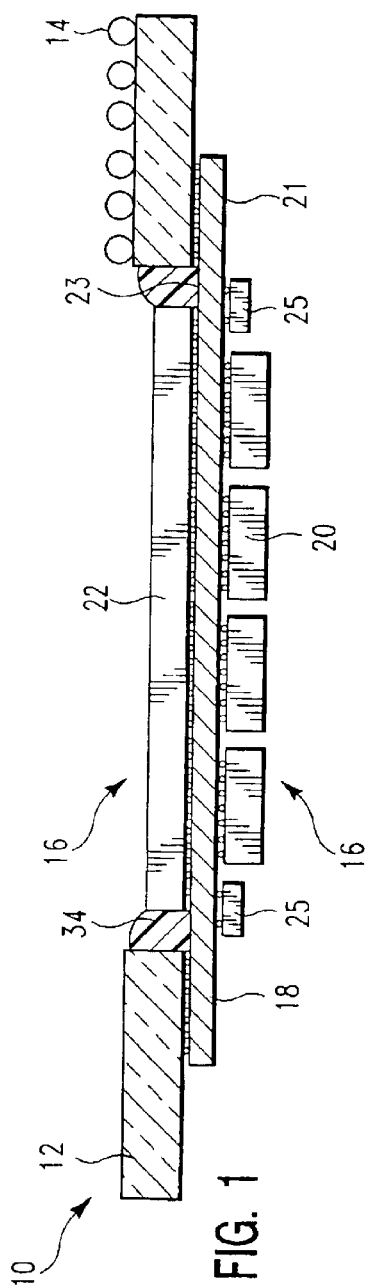
FIG. 1 is a side view of a first embodiment of the multichip module of the present invention.
Figure 4:
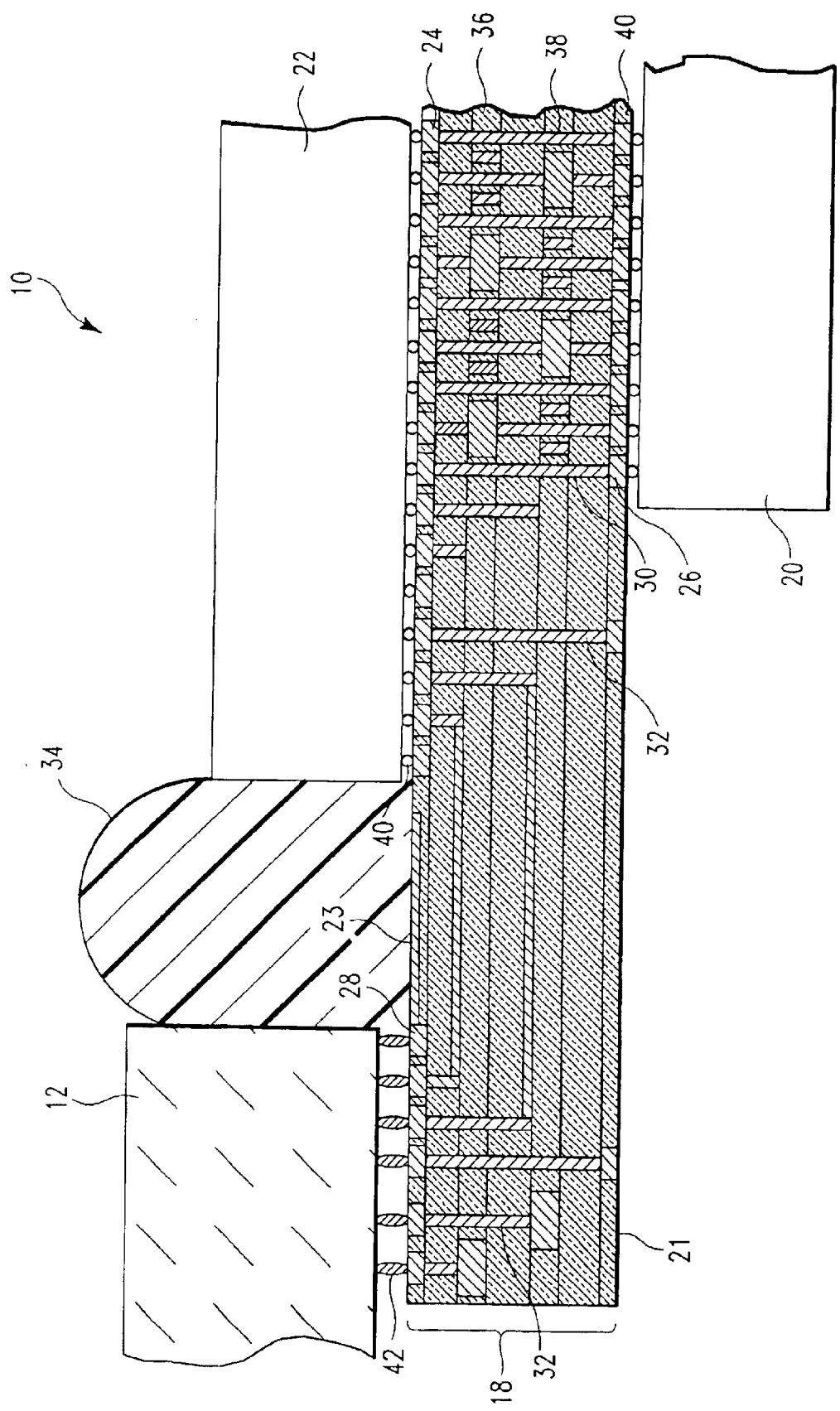
FIG. 4 is an enlarged partial cross-sectional view of the multichip module of the first embodiment of the present invention.

Referring to the Figures in more detail, and particularly referring to FIGS. 1 and 4, there is shown a first embodiment of the present invention. Multichip module 10 comprises a carrier frame 12 (hereafter referred to as "frame 12") having a plurality of contacts 14 for making contact with an article, generally the next level of packaging. As shown in FIG. 1, contacts 14 are a so-called ball grid array for making contact with a printed wiring board, the next level of packaging. Most preferably, frame 12 is made of a conventional electrically insulating material such as a ceramic or organic material. Such conventional electrically insulating materials are conventionally used for chip carriers, printed circuit boards and the like. The use of such conventional insulating materials for frame 12 is believed to be a unique use of such materials. Ball grid array contacts 14 may be only on a portion of the frame 12 as shown in FIG. 1 or can cover the entire surface of the frame 12.

The multichip module 10 further includes a multilayer thin film structure 18 which is mounted to the frame 12 and a plurality of active semiconductor devices 16 mounted to the thin film structure 18. According to the present invention, there is at least one semiconductor device 16 on each side of the thin film structure 18. As shown in FIG. 1, for purposes of illustration and not limitation, there is a single, large semiconductor device 22 on a first side 23 of the thin film structure 18 and a plurality of semiconductor devices 20 on a second side 21 of the thin film structure 18. In addition to the active semiconductor devices 16, there can also be passive devices, e.g., capacitors, on one or both sides of the thin film structure 18. For example and as shown in FIG. 1, capacitors 25 are on second side 21 of the thin film structure 18.

Details of the thin film structure 18 according to the present invention are most apparent in FIG. 4. Thin film structure 18 comprises multiple layers of an electrically insulating material typically used for thin films such as polyimide. It can be seen that thin film structure 18 further comprises a plurality of contact pads 24 for connecting to chip 22, a plurality of contact pads 26 for connecting to chip 20 and a plurality of contact pads 28 near the periphery of the thin film structure 18 for connecting to frame 12. The thin film structure 18 also comprises a plurality of wirings on a plurality of levels between the multiple layers of insulating material. In a preferred embodiment, there is wiring 30 which connects contact pads 24 to contact pads 26, and hence also chip 22 to chips 20 and wiring 32 which connects the thin film structure 18 to the frame 12. Wiring 32 can actually consist of several different types of wirings such as wiring from contact pads 24, 26 to contact pads 28 or wiring for the power and ground layers, 36, 38 respectively. As can be seen, chip 20, 22 connect to contact pads 26, 24, respectively, by small solder balls, also known as a controlled collapse chip connection (C-4). Similarly, frame 12 connects to contact pads 28 by solder balls or solder columns 42. Lastly, a ribbon of stiffening material 34, such as an epoxy, may be placed in the gap between the chip 22 and frame 12. While thin film structure 18 is normally a flexible material, the presence of the stiffening material 34 in combination with the frame 12 results in a rigid multichip module 10. It should be noted that stiffening material 34 may be left out if the particular application does not require a stiff structure and/or the thin film structure 18 is sufficiently robust to support chips 20, 22.

The end result of the multichip module 10 as just described is a multichip module design that improves on the size, weight and chip to chip interconnectivity of the prior art while also allowing adequate power and ground distribution. The thin film structure 18 is very thin, on the order of 15 to 250 microns in thickness, to reduce inductance and yet has the ability to provide high levels of power and ground current from the periphery of the thin film structure 18.

Figure 2:
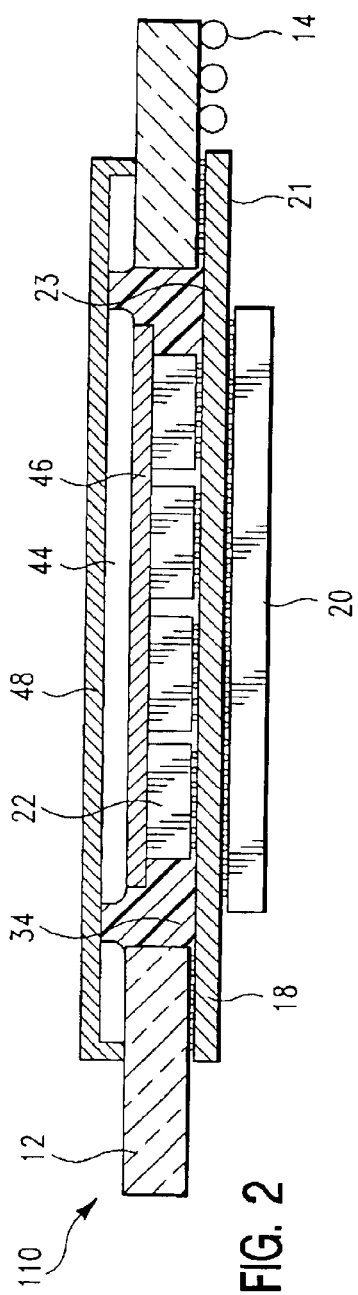
FIG. 2 is a side view of a second embodiment of the multichip module of the present invention.

Referring now to FIG. 2, a second embodiment 110 of the present invention is illustrated. Multichip module 110 has a plurality of semiconductor devices 22 on the first side 23 of thin film structure 18 and a single, large semiconductor device 20 on the second side 21 of the thin film structure 18. If desired, a heat sink device may be provided to cool semiconductor devices 22 and/or semiconductor device 20. As shown in FIG. 2, there is a heat sink device, in this case a heat spreader 44, which is used to cool semiconductor devices 22. Heat spreader 44 is joined to semiconductor devices 22, in one embodiment, by a thermal epoxy 46. Instead of a thermal epoxy, room temperature vinyl, thermal grease or other suitable material could be used as well as mechanical means. If desired, a lid 48 may be placed over heat spreader 44. Also, as can be seen in FIG. 2, the ball grid array 14 on frame 12 has been placed on the bottom of the frame 12.

Figure 3:
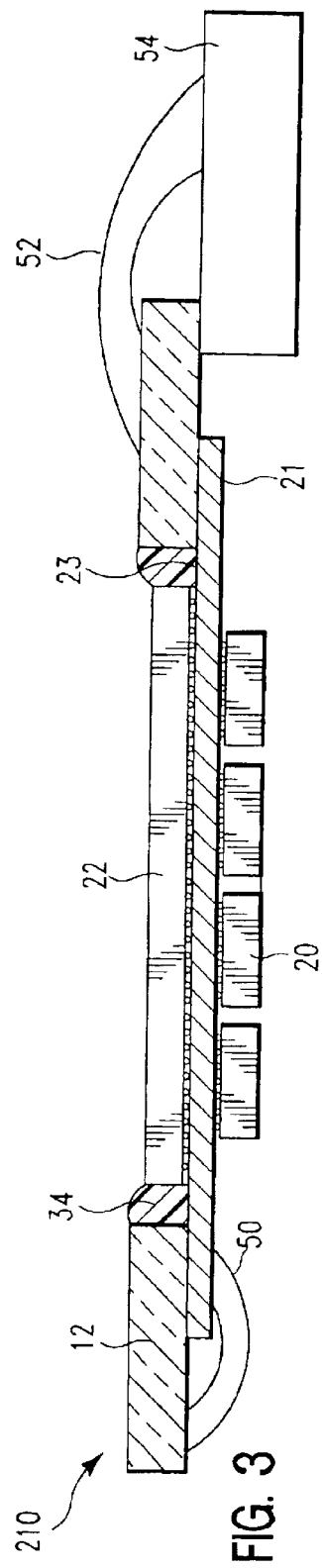
FIG. 3 is a side view of a third embodiment of the multichip module of the present invention.

A third embodiment 220 of the present invention is illustrated in FIG. 3. In this embodiment of the present invention, connections 50 from the thin film structure 18 to the frame 12 and connections 52 from the frame 12 to the board 54 (i.e., the next level of packaging) are by wirebonds instead of solder balls or solder columns.

In all of the previous embodiments, it is most preferred that semiconductor devices 20, 22 are connected to thin film structure 18 by solder balls known as the previously described C-4 connections. While wirebonds could be used in this configuration, they are not preferred.

Figure 5A:
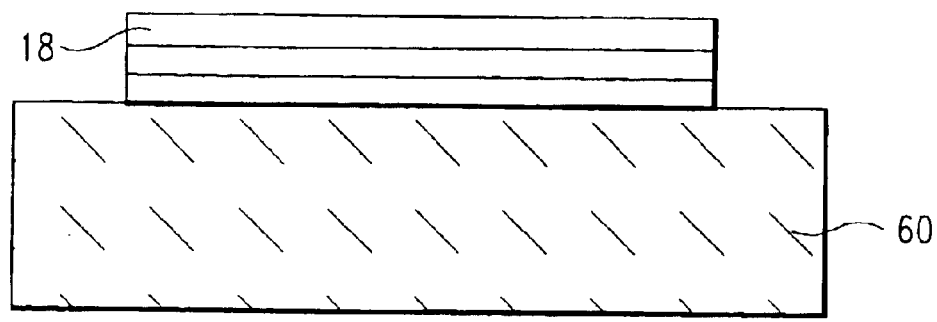
FIGS. 5A to 5C illustrate a method for forming a multichip module of the present invention.
Figure 5B:
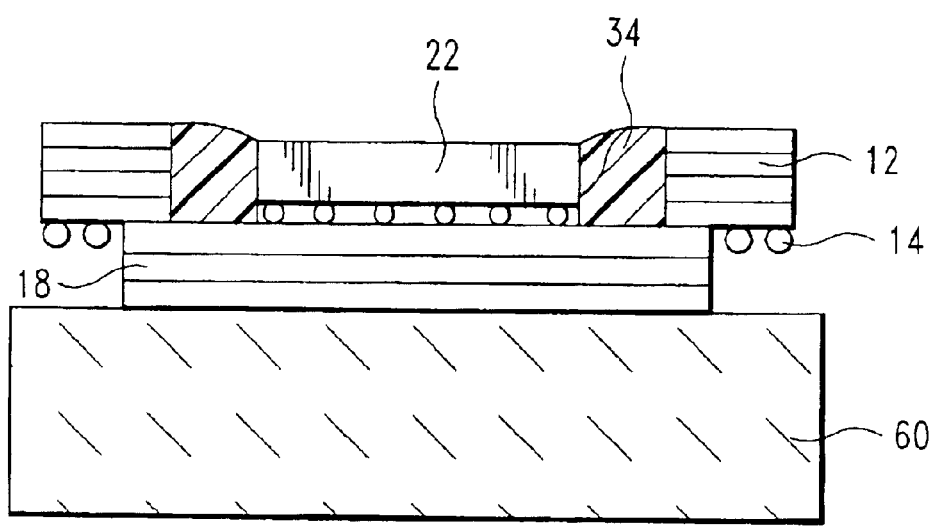
Figure 5C:
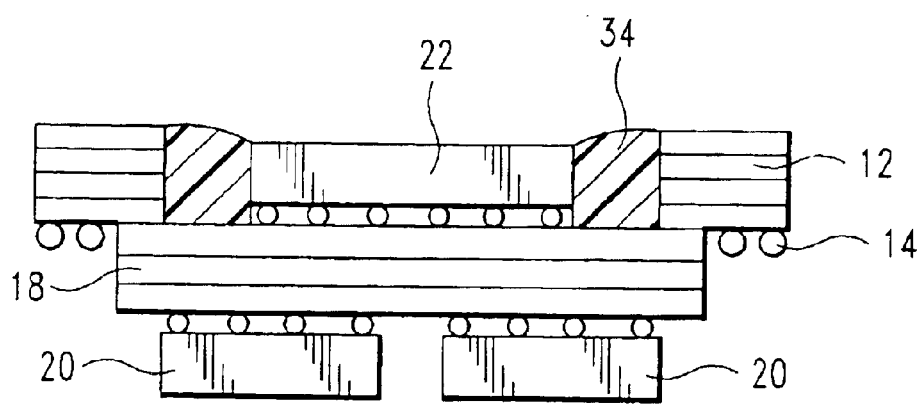

The method for forming the multichip module 10, 110, 210 according to the present invention will be described with reference to FIGS. 5A to 5C. In a first step of the invention, the thin film structure 18 is conventionally formed on a temporary carrier 60 as taught by the aforementioned Prasad et al. U.S. Pat. No. 6,281,452. Frame 12 is then joined to thin film structure 18. If electrical connection between the frame 12 and thin film structure 18 is by the solder balls or solder columns shown in FIGS. 1 and 2, then frame 12 is soldered to thin film structure 18. Underfill (e.g., epoxy underfill) may be added to the solder balls or solder columns if desired. Alternatively, if electrical connection between the frame 12 and thin film structure 18 is by wirebonds as shown in FIG. 3, then frame 12 may be adhesively joined to thin film structure 18. Then, semiconductor device(s) 22 is joined to the first side 23 of thin film structure 18 by solder reflow. Stiffening material 34 is then added between the semiconductor device 22 and frame 12. Temporary carrier 60 is then removed as taught by Prasad et al. Thereafter, semiconductor devices 20 are joined to the second side 21 of thin film structure 18 by solder reflow. It bears repeating that the number and type of semiconductor devices 20, 22 on each side 21, 23 of the thin film structure 18 are not important other than there must be at least one semiconductor device 20, 22 on each side 21, 23 of the thin film structure 18 in order to achieve the purposes and advantages of the present invention. Heat sink devices, such as the heat spreader 44 shown in FIG. 2, may then be added to complete the multichip module 10, 110, 210. A hierarchy of solders having different melt temperatures may be required due to the sequential joining of the semiconductor devices 20, 22 and heat sink device.

Figure 6A:
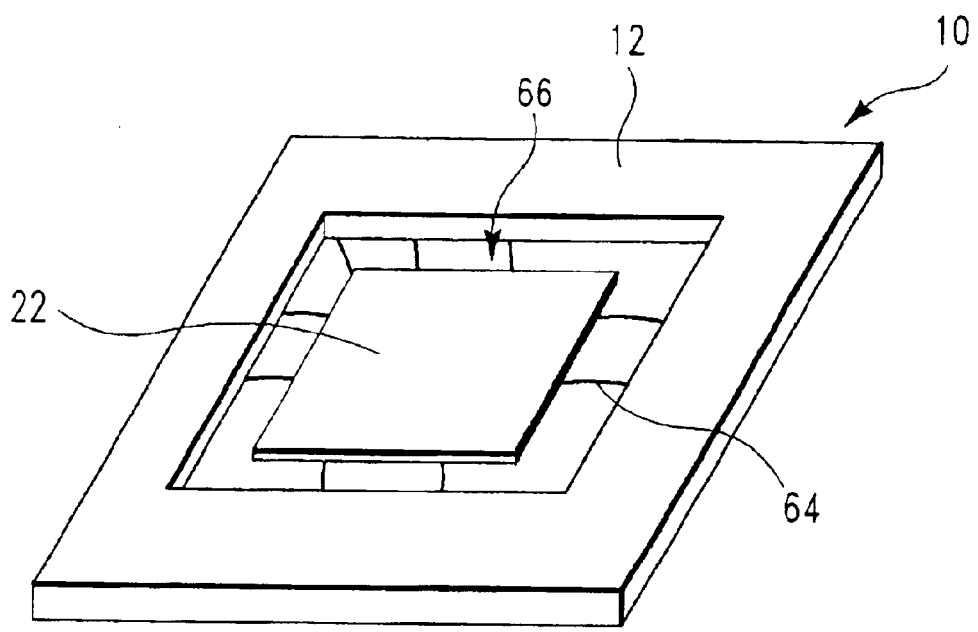
FIGS. 6A and 6B are top and bottom views, respectively, of a multichip module of the present invention.
Figure 6B:
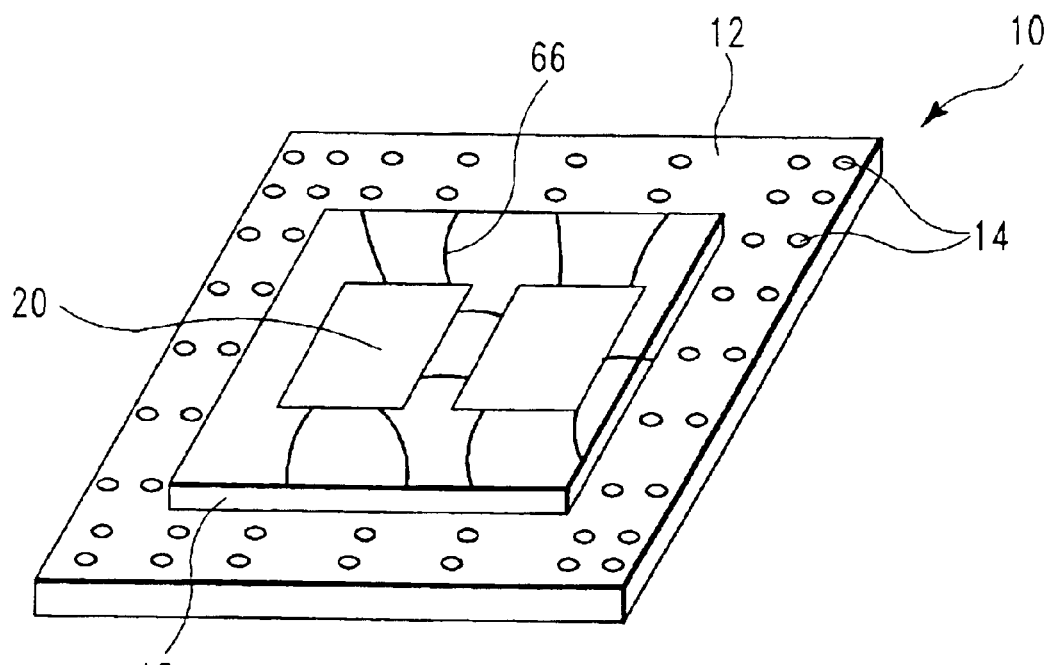

A perspective view of the assembled multichip module 10 is shown in FIGS. 6A and 6B. Referring first to FIG. 6A, shown there are frame 12 and semiconductor device 22 with the optional stiffening material being removed from the gap 62 between the frame 12 and semiconductor device 22 for clarity so as to reveal redistribution wiring 64 on thin film structure 18. Referring now to FIG. 6B, the bottom of frame 12 has ball grid array contacts 14. In a variation of the ball grid array contacts 14 shown in FIG. 1, the ball grid array contacts 14 shown in FIG. 6B cover the entire bottom surface of frame 12. Also illustrated are semiconductor devices 20 and redistribution wiring 66 on thin film structure 18. While frame 12 as shown is square, it can take on any shape, such as rectangular or circular to name a few, as necessary to achieve the purposes and advantages of the present invention. Semiconductor devices 20, 22 can be active devices such as logic or memory devices or passive devices such as capacitors. It is most preferred that there be at least one active device on each side 21, 23 of the thin film structure 18; passive devices can be on either side.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multichip module comprising:

a frame comprising an electrically insulating material and having contacts suitable for making an electrical connection with an article;

a multilayer thin film structure having a periphery mounted to the frame, wherein the frame extends beyond the periphery of the multilayer thin film structure; and a plurality of semiconductor devices mounted to the thin film structure with at least one semiconductor device on each of two opposed surfaces of the thin film structure;

the thin film structure comprising (i) a first array of pads on a first surface of the thin film structure for connection to at least one semiconductor device, (ii) a second array of pads on an opposed surface of the thin film structure for connection to at least a second semiconductor device, (iii) a third array of pads on a surface of the thin film structure and proximate to the periphery of the thin film structure for connection between the thin film structure and the frame and (iv) wiring within the thin film structure for connecting between the first and second array of pads and for connecting between the thin film structure and the third array of pads.

2. The multichip module of claim 1 wherein the wiring in the thin film structure comprises power and ground plans.

3. The multichip module of claim 1 further comprising a stiffening material only between the frame and each of the plurality of semiconductor devices on one surface of the thin film structure.

4. The multichip module of claim 1 wherein the wiring between the first and second array of pads is direct and of low inductance.

5. The multichip module of claim 1 wherein the thin film structure connects the semiconductor devices to the next level of packaging.

6. The multichip module of claim 1 wherein the frame contacts are selected from the group consisting of TAB, conductive adhesive, solder ball grid array and wire bonded.

7. The multichip module of claim 1 wherein the semiconductor devices are mounted to the thin film structure by TAB bonding, conductive adhesive bonding, controlled collapse chip control (C4) bonding or wire bonding.

8. The multichip module of claim 1 further comprising a heat sink in contact with at least one of the plurality of semiconductor devices.

9. The multichip module of claim 1 wherein the frame comprises an open area through which at least one semiconductor device is exposed.

10. The multichip module of claim 1 wherein the electrically insulating material comprises a ceramic or organic material.

11. The multichip module of claim 1 further comprising a heat sink.

12. The multichip module of claim 1 further comprising at least one passive component on one of the opposed surfaces of the thin film structure.

13. The multichip module of claim 1 wherein a signal path between semiconductor devices on the opposed surfaces of the thin film structure is on the order of the thickness of the thin film structure.

* * * * *